United States Patent
Han et al.

(10) Patent No.: US 6,563,162 B2
(45) Date of Patent: May 13, 2003

(54) SEMICONDUCTOR MEMORY DEVICE FOR REDUCING PARASITIC BIT LINE CAPACITANCE AND METHOD OF FABRICATING THE SAME

(75) Inventors: Myoung-Hee Han, Kyungki-do (KR); Young-Hoon Park, Kyungki-do (KR); Ju-Wan Kim, Seoul (KR); Ju-Bum Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/102,312

(22) Filed: Mar. 19, 2002

(65) Prior Publication Data

US 2002/0135072 A1 Sep. 26, 2002

(30) Foreign Application Priority Data

Mar. 21, 2001 (KR) .......................................... 2001-14588
Feb. 18, 2002 (KR) .......................................... 2002-8468

(51) Int. Cl.[7] ................................................ H01L 13/04
(52) U.S. Cl. ........................ 257/306; 257/300; 257/296
(58) Field of Search ........................ 257/71, 296, 303, 257/306, 305, 300, 906; 438/396, 253

(56) References Cited

U.S. PATENT DOCUMENTS

| | | | | |
|---|---|---|---|---|
| 5,250,457 A | * | 10/1993 | Dennison | |
| 5,292,678 A | * | 3/1994 | Dhong et al. | |
| 5,804,853 A | * | 9/1998 | Cronin et al. | |
| 5,886,411 A | * | 3/1999 | Kohyama | |
| 6,174,767 B1 | * | 1/2001 | Chi | |
| 6,365,955 B1 | * | 4/2002 | Lee et al. | |
| 6,403,996 B1 | * | 6/2002 | Lee | |
| 6,423,608 B1 | * | 7/2002 | Kim | |

* cited by examiner

*Primary Examiner*—Sheila V. Clark
(74) *Attorney, Agent, or Firm*—Marger Johnson & McCollom, P.C.

(57) ABSTRACT

A semiconductor memory device for reducing parasitic bit line capacitance and a method of fabricating the same are provided. The semiconductor memory device includes a conductive pad formed on a semiconductor substrate and a first interlayer insulating layer having a first contact hole that exposes the conductive pad. The first interlayer insulating layer is formed on the conductive pad and the semiconductor substrate. Bit line stacks are formed on the first interlayer insulating layer. Bit line spacers are formed from a combination of materials having different dielectric constants on the sidewalls of the bit line stack to reduce the parasitic bit line capacitance. Preferably, the bit line spacers are stack layers including silicon nitride, silicon oxide, and silicon nitride. A second interlayer insulating layer having a second contact hole is formed on the bit line stack. A conductive plug fills the first and second contact holes. A storage electrode of a capacitor is formed on the conductive plug to be connected to the conductive pad.

28 Claims, 13 Drawing Sheets

SEMICONDUCTOR MEMORY DEVICE FOR REDUCING PARASITIC BIT LINE CAPACITANCE AND METHOD OF FABRICATING THE SAME

This application claims priority from Korean Patent Application No. 2001-14588, filed on Mar. 21, 2001, the contents of which are incorporated herein by reference in their entirety.

BACKGROUND OF THE INVENTION

1. Field of the Invention

The present invention relates to a semiconductor memory device and a method of fabricating the same and, more particularly, to a semiconductor memory device for reducing parasitic bit line capacitance and a method of fabricating the same.

2. Description of the Related Art

It is important to improve the sensitivity of a sense amplifier for more accurately sensing and amplifying data stored in memory cells of semiconductor memory devices, e.g., DRAM devices. Thus, the electric potential difference $\Delta V=(Vcc/2)/[1+(Cb/Cs)]$ input to both ends of the sense amplifier must be increased. Here, Vcc, Cb, and Cs represent supply voltage, bit line capacitance, and storage capacitance, respectively.

In order to increase the electric potential difference ($\Delta V$), the ratio of Cb/Cs must be decreased. However, as the integration density of DRAM devices increases, the length of a bit line is increased. Consequently, the bit line capacitance is increased, but the electric potential difference is decreased. Also, as the integration density of DRAM devices increases, supply voltage decreases with scaling down of transistors. This further decreases the electric potential difference. To improve the sensitivity of the sense amplifier, one common approach is to increase storage capacitance. However, as the integration density of DRAM devices increases, the area of a storage capacitor is inevitably reduced and, thus, it becomes more difficult to increase storage capacitance. Consequently, bit line capacitance needs to be decreased from its present levels.

Parasitic bit line capacitance can be classified into four types: capacitance between a bit line and a p-well, capacitance between a bit line and a word line, capacitance between a bit line and a bit line, capacitance between a bit line and a storage electrode. However, parasitic bit line capacitance is mostly generated between the bit line and the storage electrode. In particular, if a buried contact, made of polysilicon to which a storage electrode and a pad are connected, is formed using a self-aligned contact technique, there is a large parasitic bit line capacitance between the storage electrode and the bit line.

Accordingly, there is an immediate need to reduce parasitic bit line capacitance to improve the sensitivity of a sense amplifier.

SUMMARY OF THE INVENTION

To solve the above problems, it is an object of the present invention to provide a semiconductor memory device for reducing parasitic bit line capacitance.

It is another object of the present invention to provide a method of fabricating the semiconductor memory device for reducing parasitic bit line capacitance.

Accordingly, to achieve the above first object, according to an embodiment of the present invention, there is provided a semiconductor memory device. The semiconductor device includes a conductive pad formed on a semiconductor substrate and a first interlayer insulating layer having a first contact hole that exposes the conductive pad. The first interlayer insulating layer is formed on the conductive pad and the semiconductor substrate. Bit line stacks are formed on the first interlayer insulating layer. The bit line stack serves as a bit line. Preferably, the bit line stack is a stack layer including a bit line conductive layer and a bit line capping layer.

Bit line spacers, which are formed from a combination of materials having different dielectric constants, are formed on the sidewalls of the bit line stack to reduce parasitic bit line capacitance. Preferably, the bit line spacers are stack layers of nitride, oxide, and silicon nitride on both sidewalls of the bit line stack. The bit line spacer are stack layers including oxide and nitride on both side walls of the bit line satack. A second interlayer insulating layer having a second contact hole that exposes the bit line stack is formed on the bit line stack. A conductive plug fills the first and second contact holes. A storage electrode of a capacitor is connected to the conductive pad via the conductive plug.

According to another embodiment of the present invention, there is a semiconductor memory device. Gate stacks are formed on a semiconductor substrate. Gate spacers are formed on the sidewalls of the gate stacks. Preferably, the gate stacks are a stack layer including a gate dielectric layer, a gate conductive layer, and a gate capping layer. A first interlayer insulating layer having a first contact hole that exposes the semiconductor substrate between the gate spacers is formed. Bit line contact (DC) and storage node contact (BC) pads fill the first contact hole. A second interlayer insulating layer having a DC contact hole which exposes the DC pad is formed. A bit line stack, which fills the DC contact hole, is connected to the DC pad. Preferably, the bit line stack is a stack layer including a barrier metal layer, a bit line conductive layer, and a bit line capping layer.

Bit line spacers, which are formed from a combination of materials having different dielectric constants to reduce parasitic bit line capacitance, are formed on both sidewalls of the bit line stack. Preferably, the bit line spacers are stack layers of nitride, oxide, and silicon nitride on the sidewalls of the bit line stack. The bit line spacers are stack layers including oxide and nitride on both sidewalls of the bit line stack. A third interlayer insulating layer having a second contact hole that exposes the BC pad is self-aligned with the bit line spacers. A conductive plug fills the second contact hole. A storage electrode which is connected to the BC pad via the conductive plug.

To achieve the second object, according to an embodiment of the present invention, there is provided a method of fabricating a semiconductor memory device. A conductive pad is formed on a semiconductor substrate. A first interlayer insulating layer is formed to cover the conductive pad. A bit line stack is formed to expose the interlayer insulating layer. Preferably, the bit line stack is a stack layer including a bit line conductive layer and a bit line capping layer.

A combination layer of materials having different dielectric constants is formed on the semiconductor substrate, on which the bit line stack is formed, to reduce parasitic bit line capacitance. The combination layer is anisotropically-etched to form bit line spacers on the sidewalls of the bit line stack. Preferably, the bit line spacers are stack layers of nitride, oxide, and nitride on both sidewalls of the bit line stack. The bit line spacers are stack layers including oxide and nitride on both sidewalls of the bit line stack. A second interlayer insulating layer is formed to fill spaces between the bit line spacers. The first and second interlayer insulating layers are patterned to form a contact hole, which is self-aligned with the bit line spacers, to expose the conductive pad. A conductive plug is formed to fill the contact hole. A storage electrode of a capacitor is formed on the conductive plug.

According to another embodiment of the present invention, a method of fabricating a semiconductor memory device is provided. Gate stacks are formed on a semiconductor substrate. Gate spacers are formed on the sidewalls of the gate stack. Preferably, the gate stack is a stack layer including a gate dielectric layer, a gate conductive layer, and a gate capping layer. A first interlayer insulating layer having a first contact hole is formed to expose the semiconductor substrate between the gate spacers. DC and BC pads are formed to fill the first contact hole. Preferably, a conductive layer is formed and planarized on the semiconductor substrate, on which the first contact hole is formed, to form the DC and BC pads. A second interlayer insulating layer having a DC contact hole is formed to expose the DC pad. A bit line stack is formed to fill the DC contact hole to be connected to the DC pad.

Bit line spacers of a combination of materials having different dielectric constants are formed on the sidewalls of the bit line stacks to reduce parasitic bit line capacitance. Preferably, the bit line spacers are stack layers of nitride, oxide, and nitride on both sidewalls of the bit line stacks. The bit line spacers are stack layers including oxide and nitride on both sidewalls of the bit line stack. A third interlayer insulating layer having a second contact hole, which is self-aligned with the bit line spacers, is formed to expose the BC pad. A conductive plug is formed to fill the second contact hole. A storage electrode, which is connected to the BC pad via the conductive plug, is formed.

As describe above, in the semiconductor memory device of the present invention, the bit line spacers are made from a combination of materials having different dielectric constants, e.g., silicon nitride, silicon oxide, and silicon nitride and can reduce parasitic bit line capacitance more than the single bit line spacer.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer may be formed directly on the other layer or the substrate, or other layers may intervene therebetween.

Figure 1:
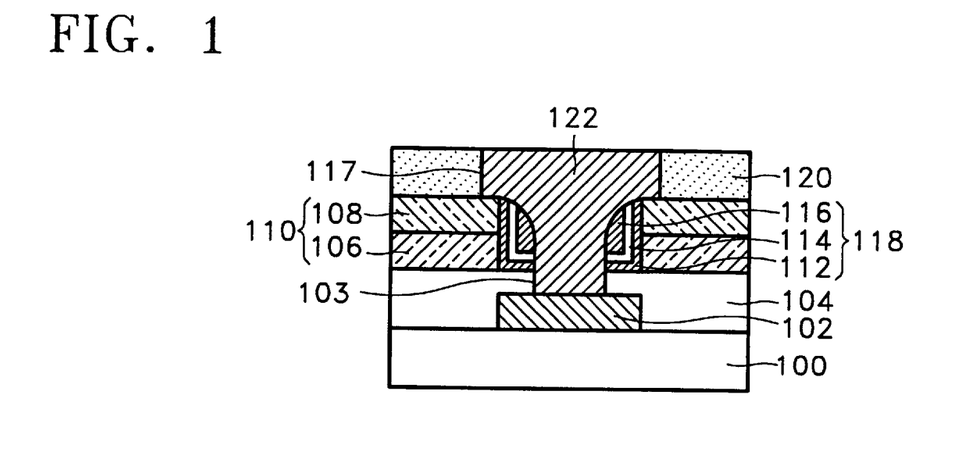
FIG. 1 is a cross-sectional view of a portion of a semiconductor memory device for reducing parasitic bit line capacitance according to the present invention.

FIG. 1 shows a portion of a semiconductor memory device for reducing parasitic bit line capacitance according to an embodiment of the present invention. In detail, a conductive pad 102 is formed on a semiconductor substrate 100, e.g., a silicon substrate. The conductive pad 102 is preferably formed of polysilicon. A first interlayer insulating layer 104 having a first contact hole 103 that exposes the conductive pad 102 is formed on the conductive pad 102 and the semiconductor substrate 100. The first contact hole 103 is aligned with a bit line spacer that will be formed later. The first interlayer insulating layer 104 is preferably formed of silicon oxide.

A bit line stack 110 is formed on the first interlayer insulating layer 104 on the semiconductor substrate 100. The bit line stack 110 includes a bit line conductive layer 106 and a bit line capping layer 108. The bit line stack 110 serves as a bit line. The bit line conductive layer 106 is preferably formed of tungsten, and the bit line capping layer 108 is preferably formed of silicon nitride having a high etching selectivity with respect to a second interlayer insulating layer which will be later formed.

Bit line spacers 118 are formed on both sidewalls of the bit line stack 110. The bit line spacers 118 are formed of a combination of materials having different dielectric constants so that parasitic bit line capacitance can be reduced. For example, the bit line spacers 118 maybe a triple layer including a nitride layer 112, an oxide layer 114, and a nitride layer 116, or the bit line spacer 118 maybe a double layer that includes an oxide layer 114 and a nitride layer 116 but not a nitride layer 112. Triple layer or double layer bit line spacers can reduce parasitic bit line capacitance better than single layer bit line spacers formed of silicon nitride which will be described in detail later. The silicon nitride layer 112 prevents the bit line stack 110 from being oxidized, and the silicon nitride layer 116 serves as an etching mask when the first contact hole 103 is formed.

A second interlayer insulating layer 120 having a second contact hole 117 that exposes the bit line stack 110 is formed on the bit line stack 110. A conductive plug 122 electrically connected to the pad 102 is formed in the first and second contact holes 103 and 117. A storage electrode (not shown) of a capacitor is electrically connected to the conductive plug 122. The conductive plug 122 connected to the storage electrode of the capacitor is connected to active areas of the semiconductor substrate 100, i.e., drain and source areas (not shown), via the conductive pad 102 (which is called a BC pad).

FIGS. 2A through 2E are cross-sectional views describing a method of fabricating the semiconductor memory device shown in FIG. 1 according to an embodiment of the present invention.

Figure 2A:
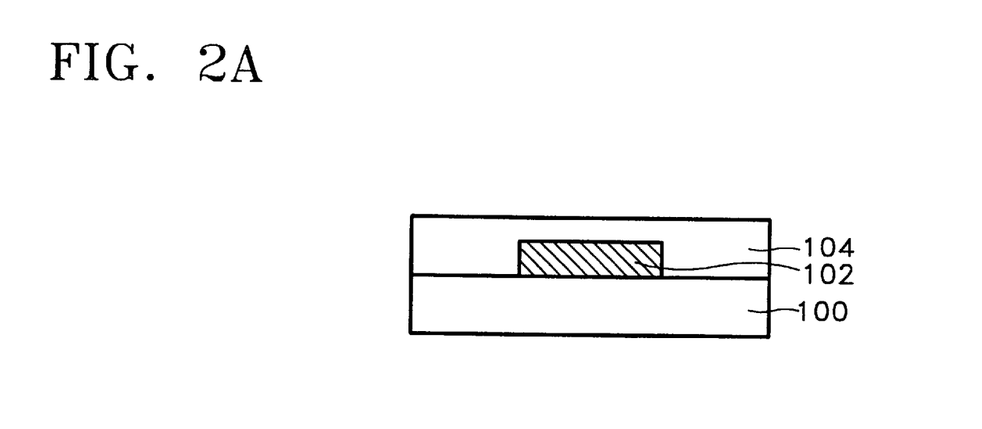
FIGS. 2A through 2E are cross-sectional views describing a method of fabricating the semiconductor memory device shown in FIG. 1.

Referring to FIG. 2A, a conductive pad 102 is formed on a semiconductor substrate 100, e.g., a silicon substrate. The conductive pad 102 is formed of polysilicon. A first interlayer insulating layer 104 is formed on the semiconductor substrate 100, on which the conductive pad 102 is formed, to cover the conductive pad 102. The first interlayer insulating layer 104 is formed of silicon oxide. However, other suitable materials can be used instead of polysilicon or silicon oxide.

Figure 2B:
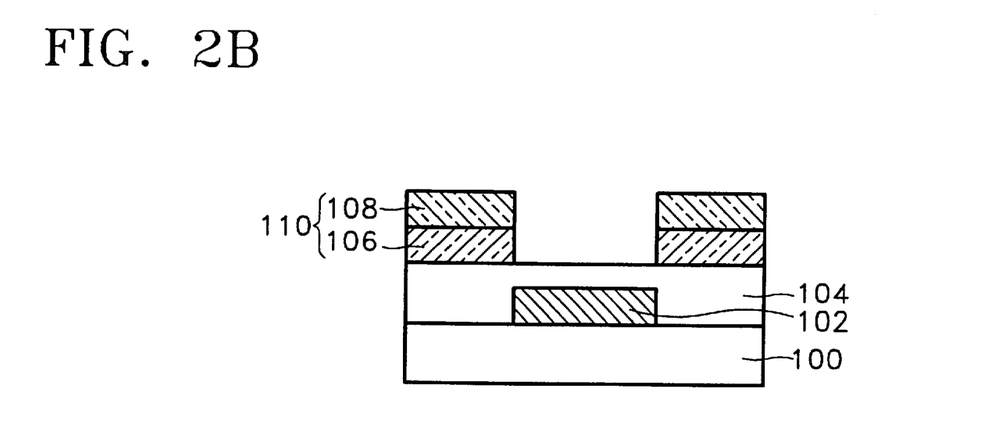

With reference to FIG. 2B, a bit line stack 110 is formed on the first interlayer insulating layer 104 so that a portion of the first interlayer insulating layer 104 on the conductive pad 102 is exposed. The bit line stack 110 is preferably a stack layer of a bit line conductive layer 106 and a bit line capping layer 108. The bit line conductive layer 106 is formed of polysilicon, and the bit line capping layer 108 is formed of silicon nitride. However, other suitable materials can be used instead of polysilicon or silicon nitride.

Figure 2C:
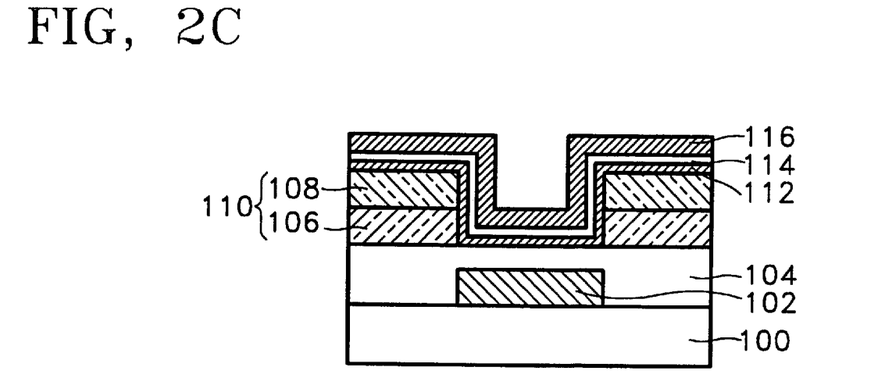

Referring to FIG. 2C, a combination layer of materials having different dielectric constants, e.g., a triple layer including a nitride layer 112, an oxide layer 114, and a nitride layer 116 or double layer include an oxide layer 114 and a nitride layer 116 but not a nitride layer 112, is formed on the semiconductor substrate 100 on which the bit line stack 110 is formed to reduce parasitic bit line capacitance. The nitride layer 112, a in triple layer structure which covers the bit line stack 110, prevents the bit line stack 110 from being oxidized, the nitride layer 112 is formed by a nitrogen treatment, e.g., a nitrogen plasma treatment after formation of the bit line stack, or by a conventional method to a thickness of about 200 angstrom. The nitrogen treatment is performed using a single or a combination of gases selected form $NH_3$ and $N_2$. In a double layer structure, an oxide layer 114 on the sidewalls of the bit line stack 110 is formed by using an impurity undoped oxide layer or plasma oxide layer having a good step coverage. The oxide layer 114 is formed to have a thickness of 500 angstrom or less. The silicon oxide layer 114 formed on the silicon nitride layer 112 reduces parasitic bit line capacitance, and the silicon nitride layer 116 serves as an etching mask when a contact hole is formed later.

Figure 2D:
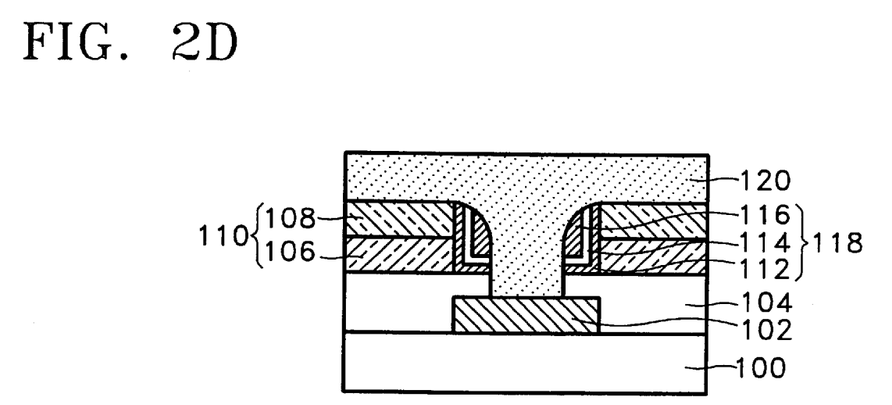

With reference to FIG. 2D, the triple layer of the silicon nitride layer 112, the silicon oxide layer 114, and the silicon nitride layer 116 is etched by anisotropic etching, thereby forming bit line spacers 118 on both sidewalls of the bit line stack 110. A second interlayer insulating layer 120 is formed on the semiconductor substrate 100 on which the bit line spacers 118 are formed to fill spaces between the bit line spacers 118. The second interlayer insulating layer 120 is formed of a dielectric material, for example, silicon oxide.

Figure 2E:
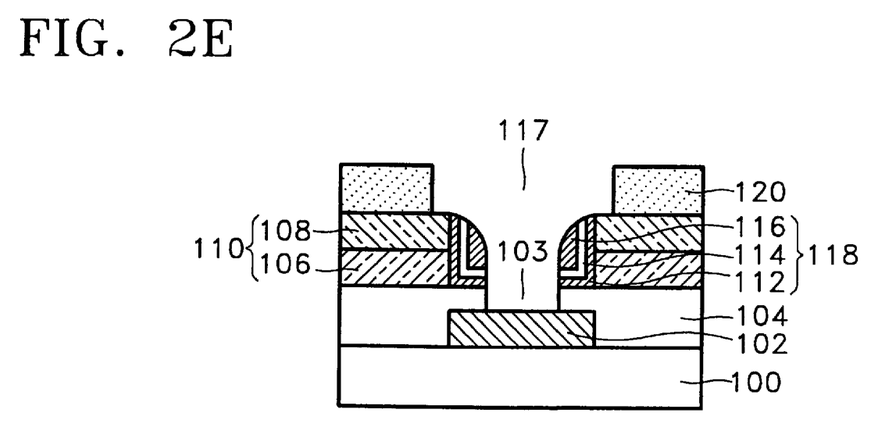

Referring to FIG. 2E, the first and second interlayer insulating layers 104 and 120 are patterned in a photolithographic etching process, thereby forming contact holes 103 and 117 aligned with the bit line spacers 118. The contact holes 103 and 117 are referenced as a first contact hole 113 aligned with the bit line spacers 118 to expose the pad 102, and a second contact hole 117 that exposes the bit line stack 110.

As shown in FIG. 1, a conductive layer is formed on the semiconductor substrate 100 on which the first and second contact holes 103 and 117 are formed. The conductive layer is planarized by chemical mechanical polishing (CMP) or etching back to form a conductive plug 122. A storage electrode (not shown) of a capacitor is formed on the conductive plug 122. Thus, the storage electrode is connected to the conductive pad 102 via the conductive plug 122.

Figure 3:
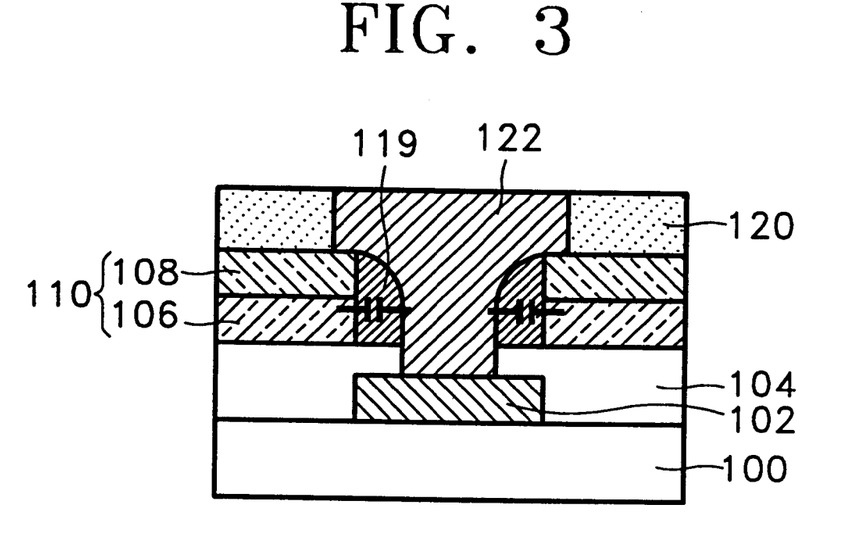
FIG. 3 shows single layer bit line spacers in the semiconductor memory device shown in FIG. 1.
Figure 4:
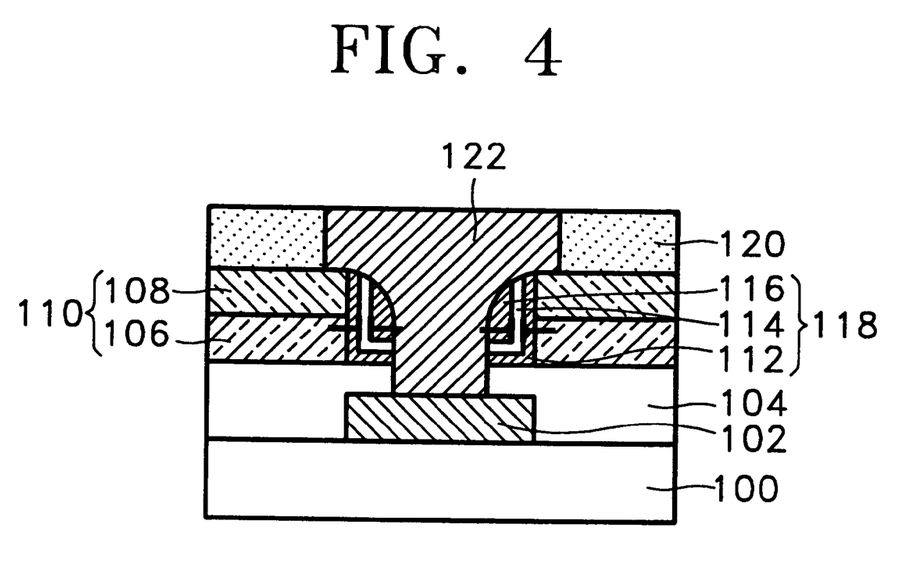
FIG. 4 shows bit line spacers formed of a combination of materials having different dielectric constants.

FIG. 3 is a view illustrating single layer bit line spacers in the semiconductor memory device shown in FIG. 1, and the FIG. 4 is a view illustrating bit line spacers made from a combination of materials having different dielectric constants as shown in FIG. 1. Like reference numerals in the FIGS. 3 and 4 denote the same members in FIG. 1.

Bit line spacers 119 may be a single layer, e.g., a silicon nitride layer, in a semiconductor memory device shown in FIG. 3. Also, bit line spacers 118 may be made from a combination of materials having different dielectric constants, e.g., the combination of a silicon nitride layer 112, a silicon oxide layer 114, and a silicon nitride layer 116, in a semiconductor memory device shown in FIG. 4. In other words, the bit line spacers 119 of FIG. 3 are formed of silicon nitride having a dielectric constant of 7–8, whereas the bit line spacers 118 of the semiconductor memory device shown in FIG. 4 have the silicon oxide layer 114 having a dielectric constant of 3–4 interposed between the silicon nitride layer 112 and the silicon nitride layer 116. Thus, the bit line spacers 118 shown in FIG. 4 can reduce parasitic capacitance between the plug 122 and a bit line stack 110, i.e., a bit line.

Hereinafter, described is an application of the above principles to a semiconductor memory device.

Figure 5:
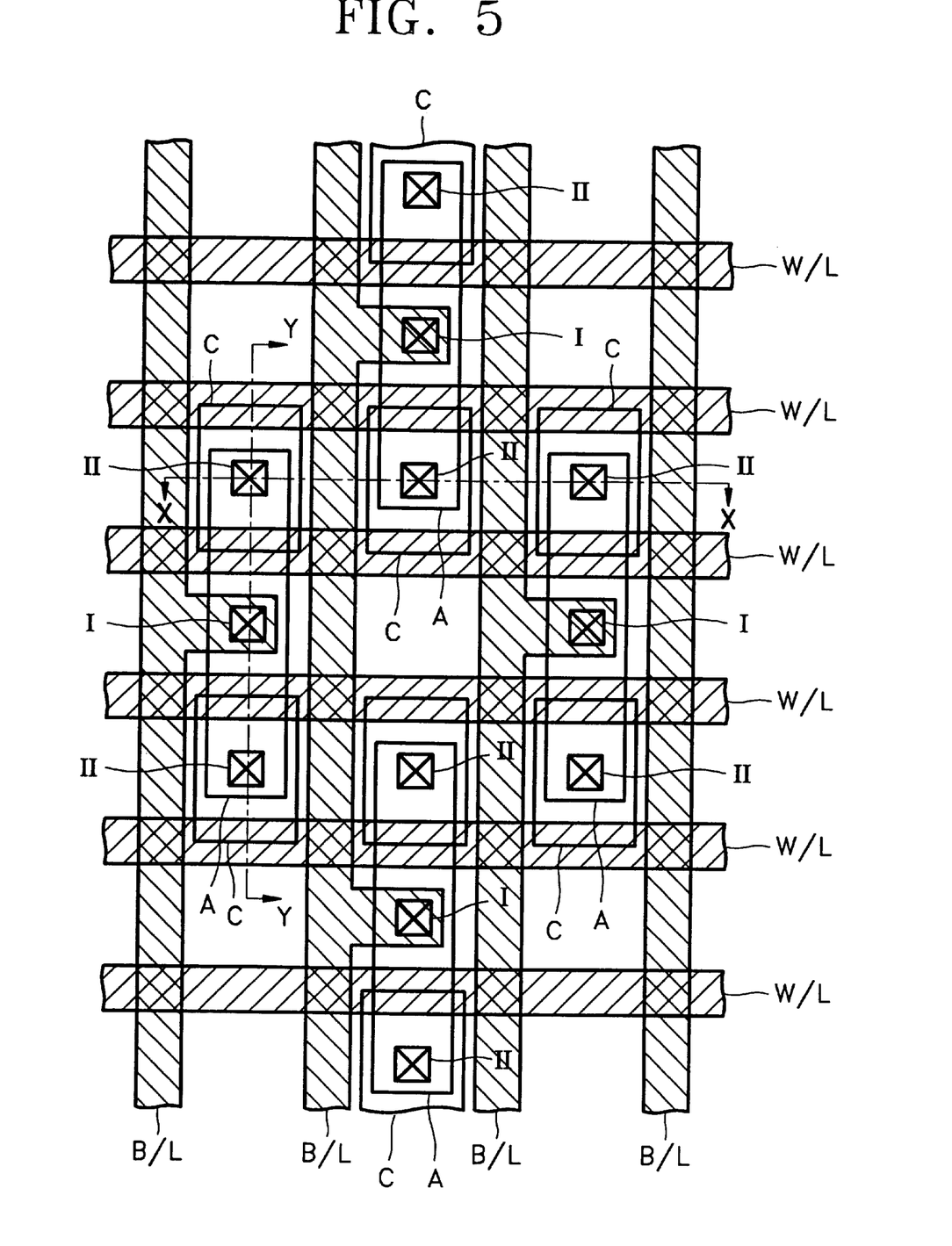
FIG. 5 is a layout diagram of the semiconductor memory device according to the present invention.

FIG. 5 is a layout diagram of the semiconductor memory device according to an embodiment of the present invention. Referring to FIG. 5, isolation layers define an active area A on which two word lines W/L pass. A bit line B/L is on a different level than a word line and is preferably substantially perpendicular to the word line W/L. A bit line contact or DC contact connected to the bit line B/L is formed on a drain area formed in the active area A, and a storage node contact or BC contact connected to a storage electrode, i.e., a capacitor lower electrode is formed on a source area formed in the active area A. A storage electrode C of a capacitor of the semiconductor memory device is formed on the BC contact.

FIGS. 6 through 20 are cross-sectional views describing a method of fabricating a semiconductor memory device taken along lines Y—Y and X—X shown in FIG. 5 and the structure thereof. For FIGS. 6 through 20, the cross-sections taken along the Y—Y of FIG. 5 are shown on the left, and the cross-sections taken along the line X—X of FIG. 5 are shown on the right.

Figure 6:
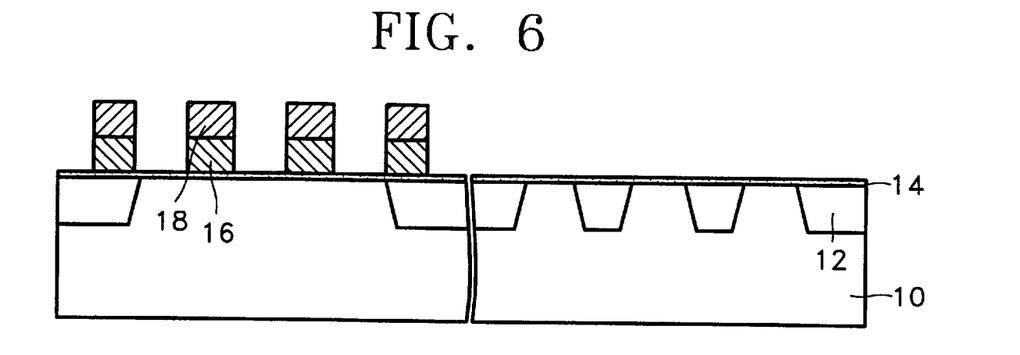
FIGS. 6 through 20 are cross-sectional views describing a method of fabricating the semiconductor memory device taken along lines Y—Y and X—X shown in FIG. 5 and the structure thereof.

Referring to FIG. 6, isolation areas 12 are formed on a semiconductor substrate 10, e.g., a silicon substrate, to define active areas (the area A shown in FIG. 5). The isolation areas 12 are preferably formed in a trench shape. However, they may also be formed other shapes such as by using a local oxidation of silicon (LOCOS) technique.

A gate dielectric layer 14 is formed on the active areas A to a thickness of 40–80 Å. A gate conductive layer 16 and a gate capping layer 18 are formed on the gate dielectric layer 14. The gate conductive layer 16 is formed to a thickness of 500–2000 Å. The gate capping layer 18 is preferably a silicon nitride layer having a thickness of 500–2500 Å, with a very low etching selectivity with respect to a silicon oxide layer, which will be used as an interlayer insulating layer later. A metal silicide layer (not shown) may be formed between the gate conductive layer 16 and the gate capping layer 18 to reduce gate resistance.

Figure 7:
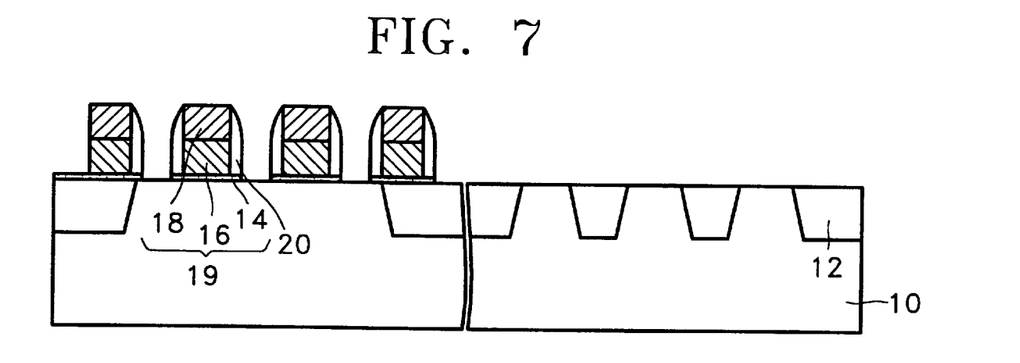

With reference to FIG. 7, an insulating layer is formed on the semiconductor substrate 10 on which the gate dielectric layer 14, the gate conductive layer 16, and the gate capping layer 18 are formed. The insulating layer is etched by anisotropic etching, thereby forming gate spacers 20 on the sidewalls of the gate conductive layer 16 and the gate capping layer 18. The gate spacers 20 are formed of silicon nitride having a thickness of 400~1500 Å with a high etching selectivity with respect to a silicon oxide layer, which will be used as an interlayer insulating layer later. Portions of the gate dielectric layer 14 on which the gate conductive layer 16 is not formed are removed during the anisotropic etching.

In this embodiment, the portions of the gate dielectric layer 14 on which the gate conductive layer 16 is not formed are removed when the gate spacers 20 are formed, however, they may be removed when the gate conductive layer 16 and the gate capping layer 18 are formed. Hereinafter, the structure where the gate dielectric layer 14, the gate conductive layer 16, and the gate capping layer 18 are stacked is referred to as a gate stack 19. The gate stack 19 serves as a word line W/L.

Figure 8:
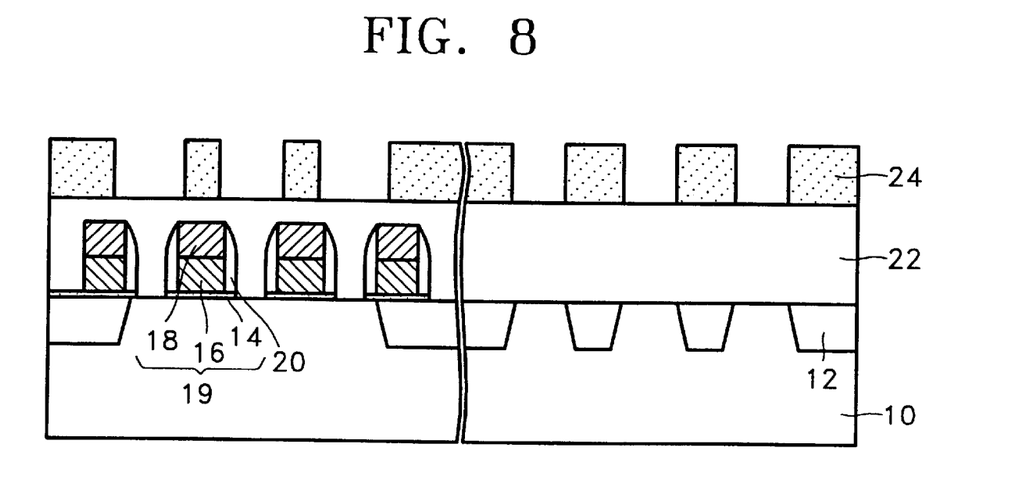

With reference to FIG. 8 a first interlayer insulating layer 22 is formed on the semiconductor substrate 100 on which the gate spacers 20 and the gate stack 19 are formed to fill spaces between the gate spacers 20. The first interlayer insulating layer 22 is formed of silicon oxide having a thickness of about 1500 Å. A first photoresist pattern 24 is formed on the first interlayer insulating layer 22 in a photolithographic etching process.

Figure 9:
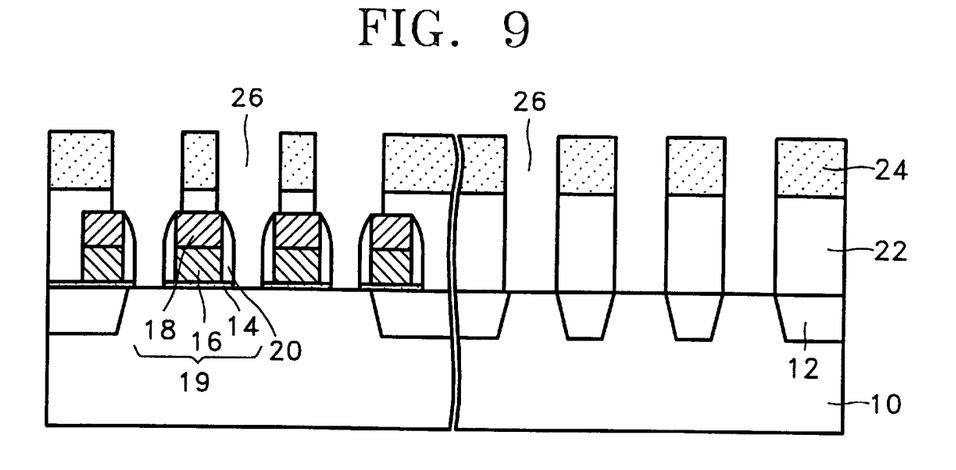

Referring to FIG. 9, the first interlayer insulating layer 22 between the gate spacers 20 is etched by a self-aligned contact etching method using the first photoresist pattern 24 as an etching mask, thereby forming a first contact hole 26 exposing a portion of the surface of the semiconductor substrate 10 between the gate spacers 20. Thus, first interlayer insulating layer 22 having the first contact hole 26 is formed.

Figure 10:
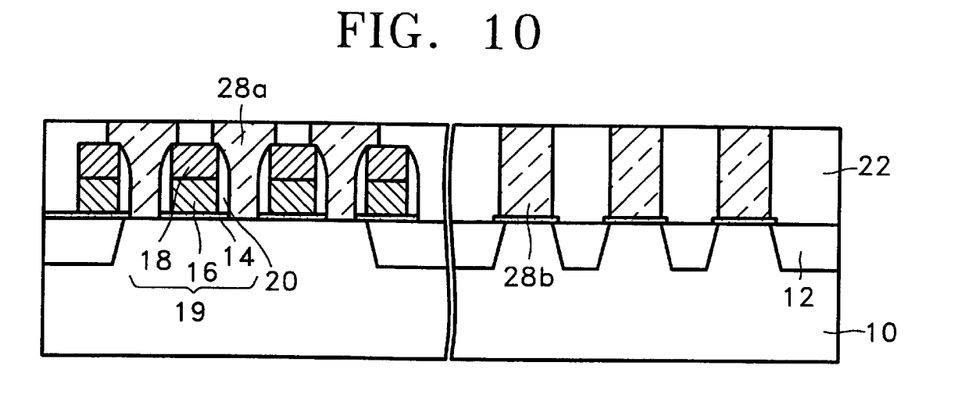

With reference to FIG. 10, the first photoresist pattern 24 is removed. A conductive layer is formed on the semiconductor substrate 10, on which the first contact hole 26 is formed, to fill the first contact hole 26. The conductive layer is planarized by etch back or CMP. The conductive layer is formed of polysilicon having a thickness of 500–2500 Å. Then, conductive pads 28a and 28b, which are separated from each other by the gate stack 19 and the gate spacers 20, are formed. The conductive pads 28a and 28b serve as a bit line contact pad or DC pad 28a and a storage node contact pad or BC pad 28b.

Figure 11:
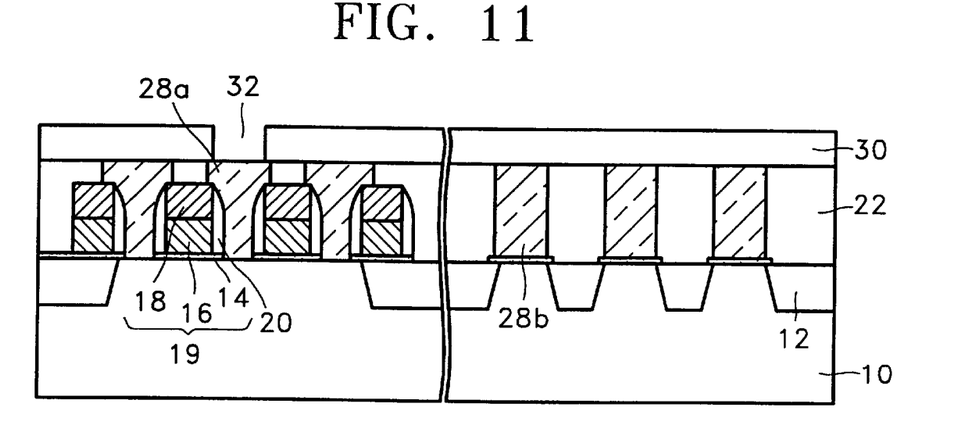

Referring to FIG. 11, a second interlayer insulating layer 30 is formed on the semiconductor substrate 10, on which the conductive pads 28a and 28b are formed, to fully cover the conductive pads 28a and 28b. The second interlayer insulating layer 30 is formed of silicon oxide having a thickness of 400–1500 Å. The second interlayer insulating layer 30 is patterned to form a bit line contact hole or DC contact hole 32 exposing one of the conductive pads, i.e., the DC pad 28a. The DC contact hole 32 will be connected to a bit line later. As a result, the second interlayer insulating layer 30 having the DC contact hole 32 exposing the DC pad 28a is formed.

Figure 12:
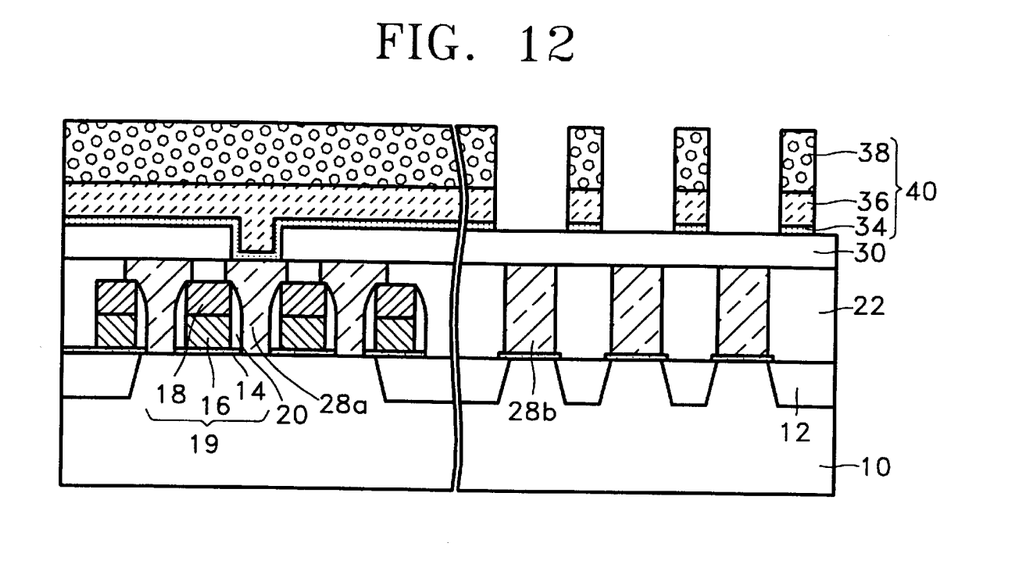

With reference to FIG. 12, bit line stacks 40 are formed overlying the DC contact hole 32 and the interlayer insulating layer 30 to fill the DC contact hole 32. The bit line stack 40 serves as a bit line. The bit line stack 40 is formed by stacking and patterning a barrier metal layer 34, a bit line conductive layer 36, and a bit line capping layer 38, sequentially. The barrier metal layer 34 is preferably formed of Ti/TiN having a thickness of 50–800 Å. The bit line conductive layer 36 is preferably formed of tungsten having a thickness of 500–1500 Å. The bit line capping layer 38 is preferably formed of silicon nitride having a thickness of 1000–2500 Å.

Figure 13:
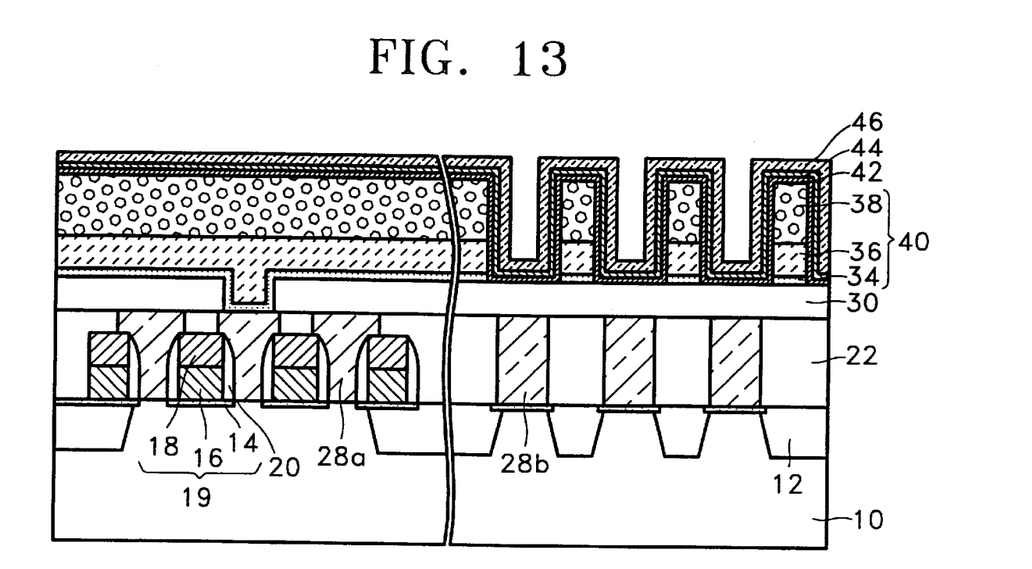

Referring to FIG. 13, a combination layer of materials having different dielectric constants is formed on the semiconductor substrate 10, on which the bit line stack 40 is formed, to reduce parasitic bit line capacitance. For example. A triple layer having a nitride layer 42, a oxide layer 44, and a nitride layer 46, or a double layer having an oxide layer 44 and a nitride layer 46 but not a nitride layer 42 is formed. The nitride layer 42 in a triple layer structure covers the bit line stack 40 to prevent the bit line stack 40 from being oxidized, The nitride layer 112 is formed by a nitrogen treatment, e.g., a nitrogen plasma treatment after formation of the bit line stack, or by a conventional method to a thickness of about 200 Å. The nitrogen treatment is performed using a single or combination of gases selected from $NH_3$ and $N_2$. In a double layer structure, an oxide layer 114 on the sidewalls of the bit line stack 110 is formed by using an undoped oxide layer or plasma oxide layer having a good step coverage. The oxide layer 114 is formed to have a thickness of 500 Å or less. The silicon oxide layer 44 formed on the silicon nitride layer 42 reduces parasitic bit line capacitance. The silicon nitride layer 46 serves as an etching mask when a contact hole is formed later.

Figure 14:
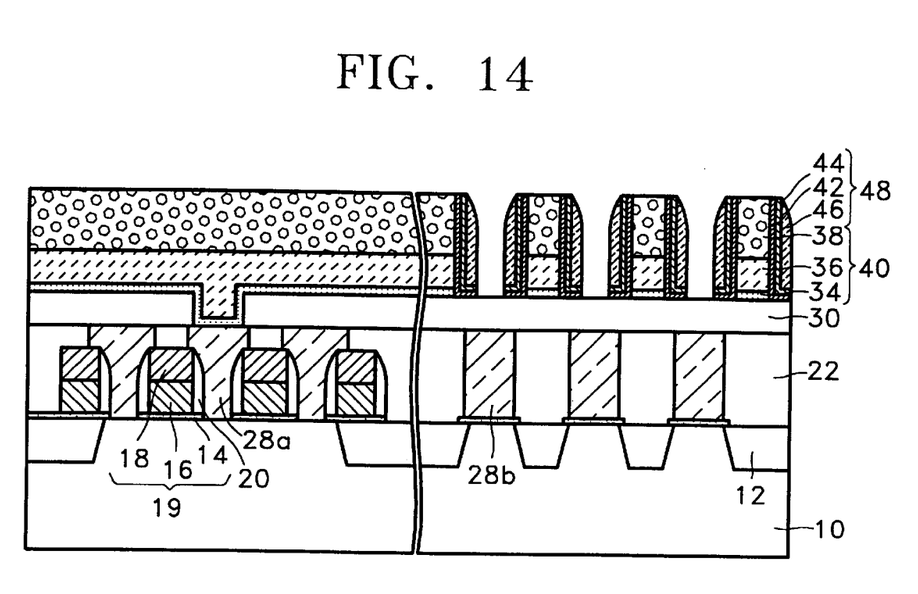

With reference to FIG. 14, the combination layer of the silicon nitride layer 42, the silicon oxide layer 44, and the silicon nitride layer 46 is etched by anisotropic etching, thereby forming bit line spacers 48 on both sidewalls of the bit line stack 40. The bit line spacers 48 made of materials having different dielectric constants reduce parasitic bit line capacitance as previously described.

Figure 15:
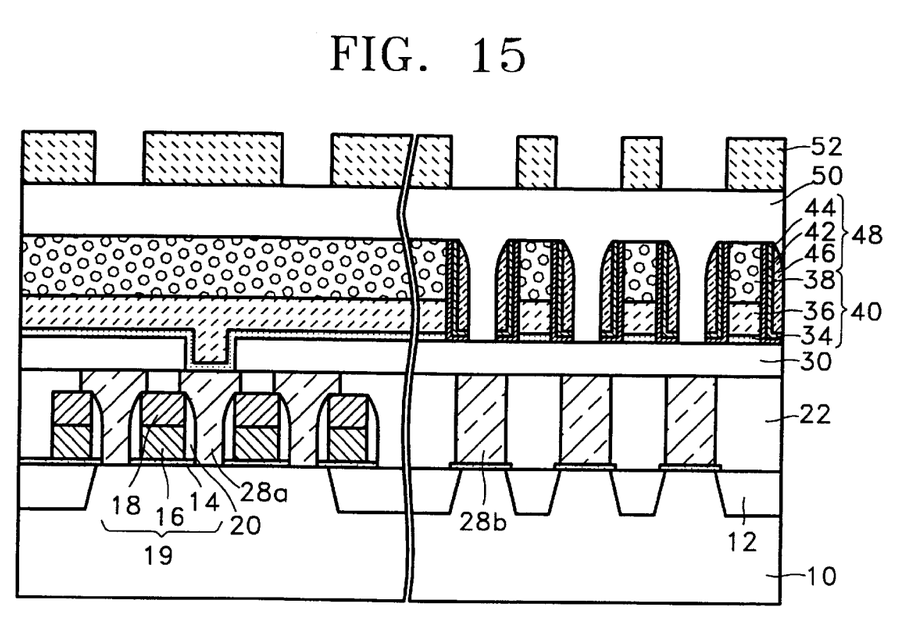

Referring to FIG. 15, a third interlayer insulating layer 50 is formed on the overlying the bit line stack 40 and the bit line spacers 48 to fill spaces between the bit line spacers 48. The third interlayer insulating layer 50 is formed of silicon oxide having a thickness of 500–8000 Å. A second photoresist pattern 52 exposing the BC pad 28b is formed on the third interlayer insulating layer 50.

Figure 16:
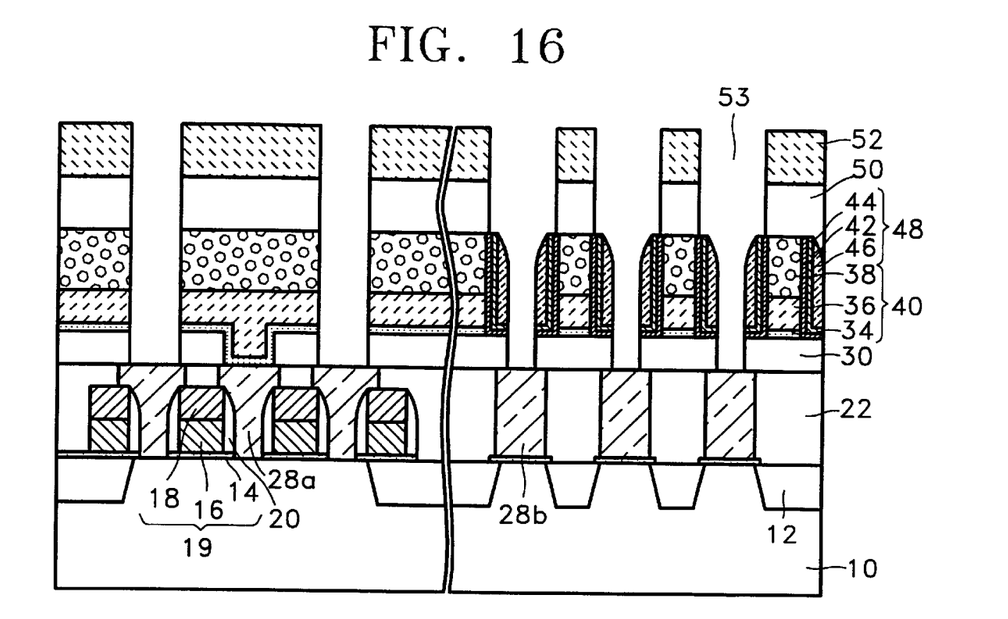

With reference to FIG. 16, the second and third interlayer insulating layers 30 and 50 are etched by self-aligned anisotropic etching using the second photoresist pattern 52 as an etching mask, thereby forming a second contact hole 53 aligned with the bit line spacers 48 to expose the BC pad 28b.

Figure 17:
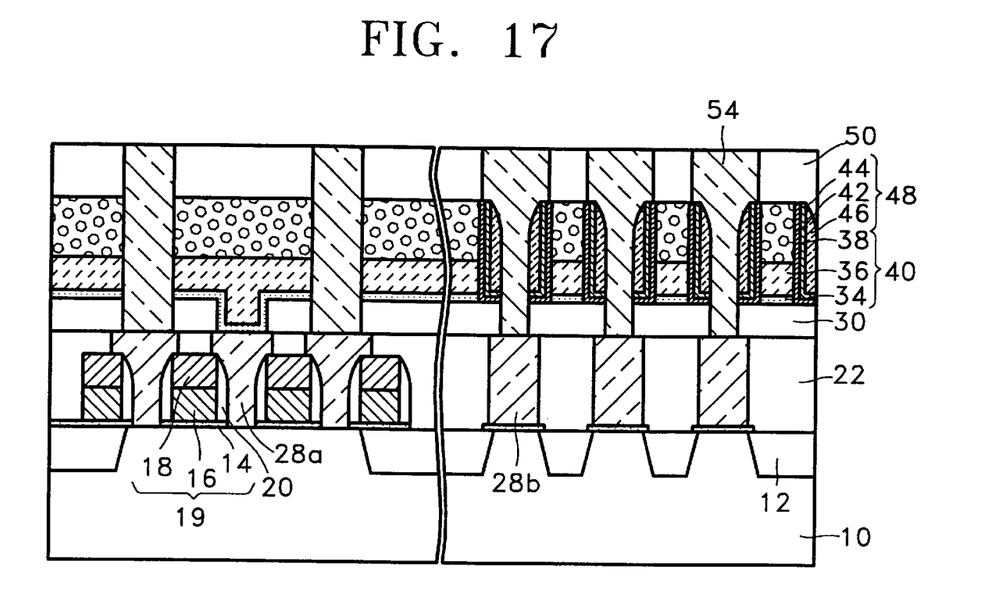

Referring to FIG. 17, a conductive layer is formed within the second contact hole 53 is formed to fill the second contact hole 53. The conductive layer is planarized by etch back or CMP. The conductive layer is formed of polysilicon having a thickness of 1000–3000 Å. Then, a conductive plug 54, which is separated from another conductive plug by the second and third interlayer insulating layers 30 and 53 and the bit line spacer 48, are formed. The conductive plug 54 will be connected to a storage electrode of a capacitor in a subsequent process.

Figure 18:
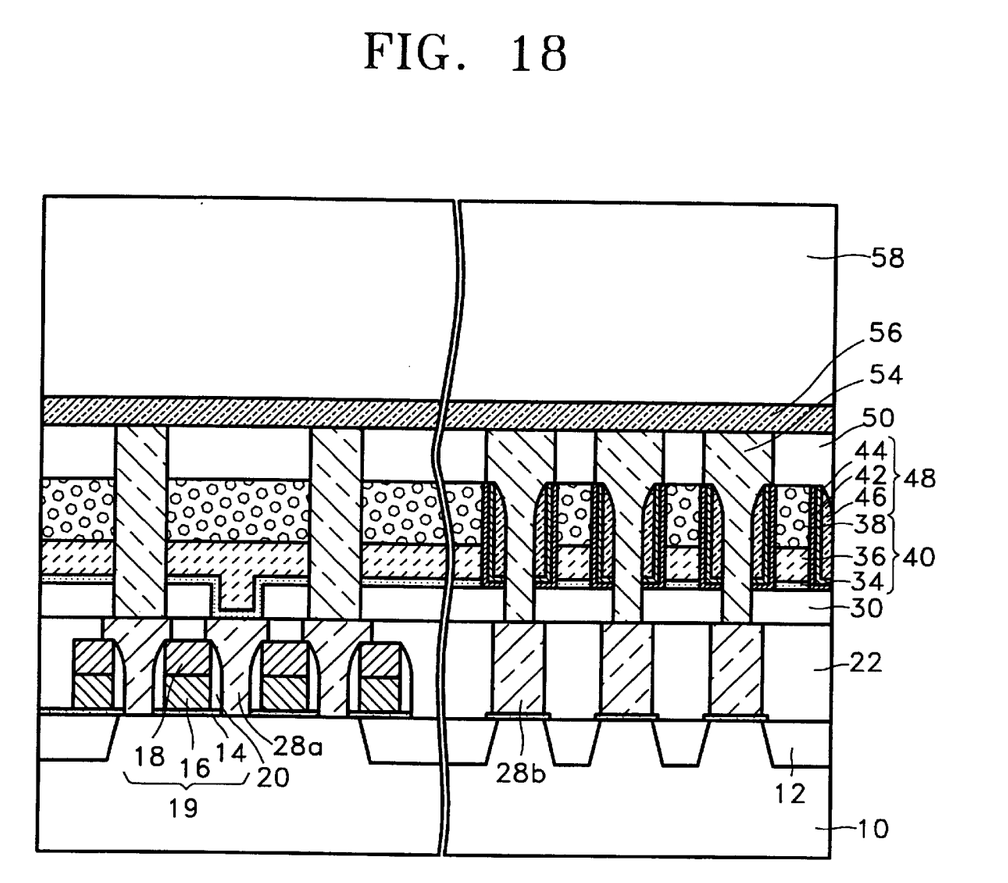
Figure 19:
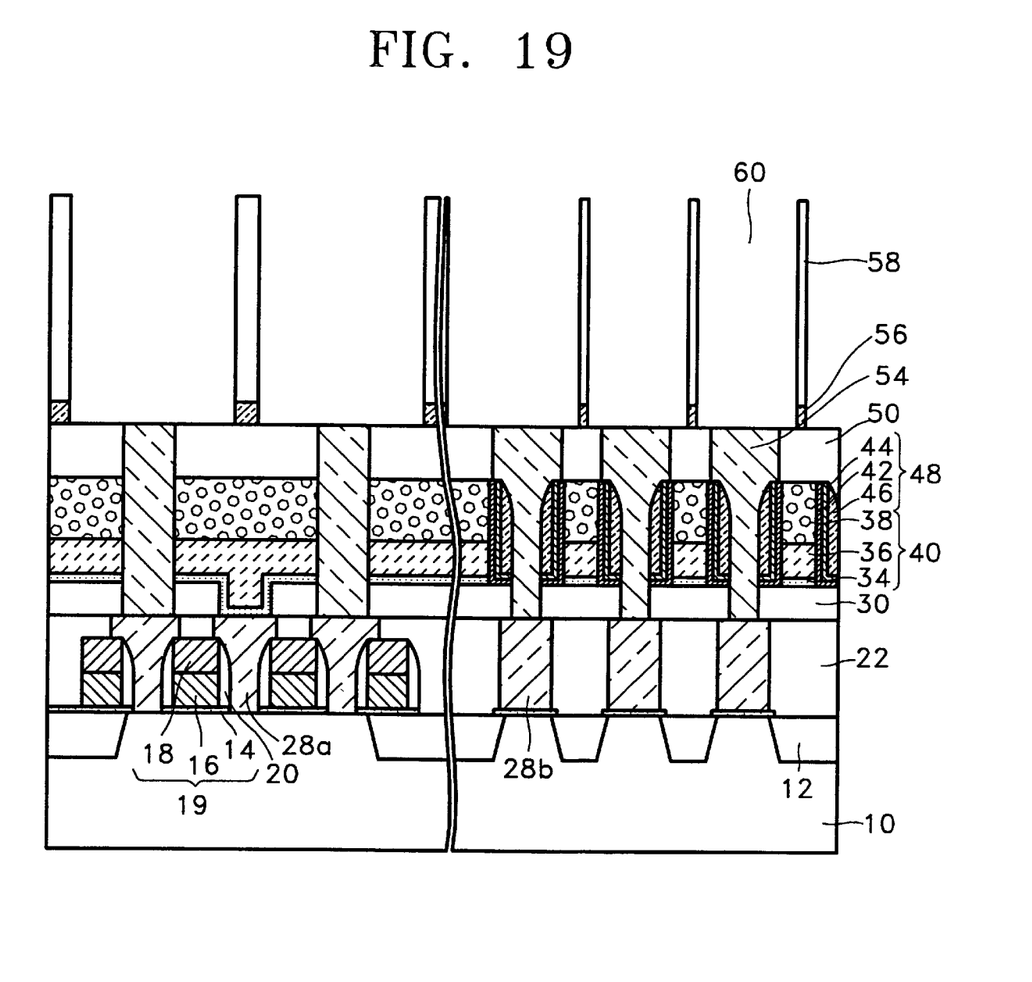

With reference to FIGS. 18 and 19, fourth and fifth interlayer insulating layers 56 and 58 are formed on the third interlayer insulating layer 53 and the conductive plug 54. The fourth interlayer insulating layer 56 is preferably formed of silicon nitride, and the fifth interlayer insulating layer is preferably formed of silicon oxide. The fourth and fifth interlayer insulating layers 56 and 58 are etched by anisotropic etching, thereby forming a storage node contact hole or BC contact hole 60 exposing the conductive plug 54.

Figure 20:
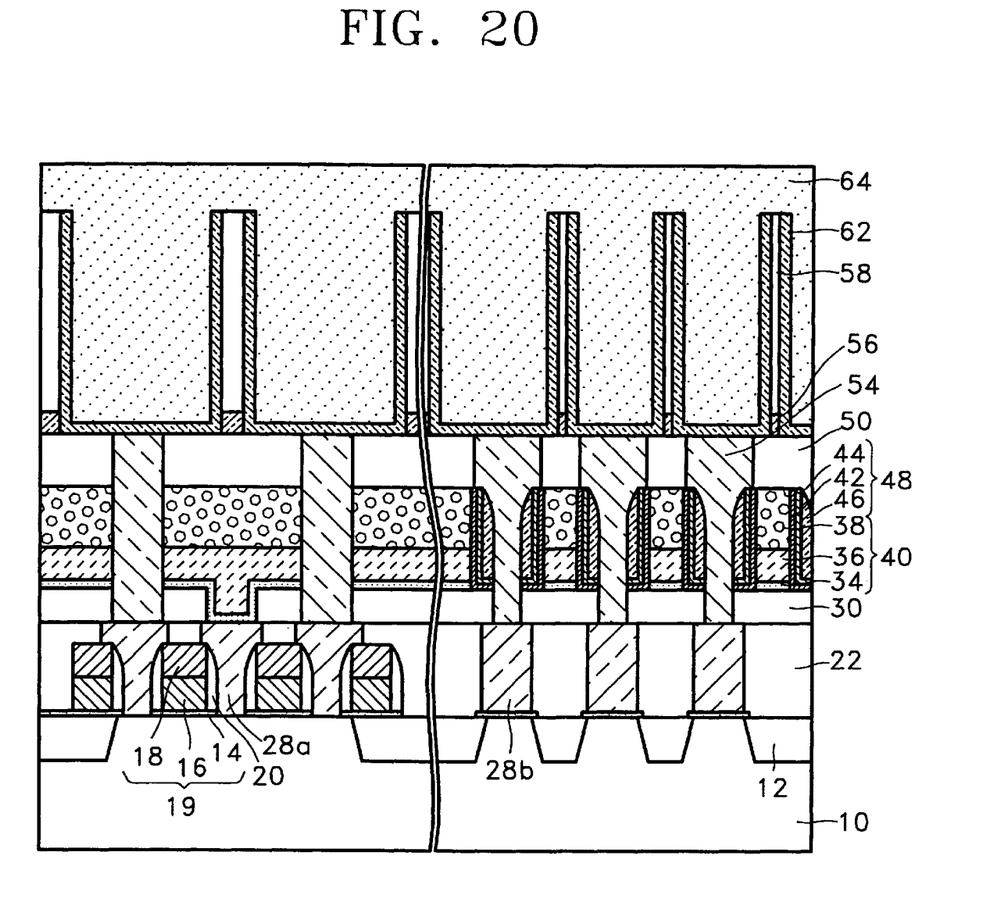

Referring to FIG. 20, a storage electrode 62 of a capacitor is formed on the side walls and bottom of the BC contact hole 60. The storage electrode 62 is electrically connected to the BC pad 28b via the conductive plug 54. Specifically, a conductive layer is formed on the BC contact hole 60, and then planarized by CMP or etch back so that the storage electrode 62 is separated from another storage electrode. Capacitor dielectric layers (not shown) are formed on the storage electrodes and then a plate electrode 64 of a capacitor is formed to fill the BC contact hole 60. The storage and plate electrodes 62 and 64 are preferably formed of polysilicon.

Figure 21:
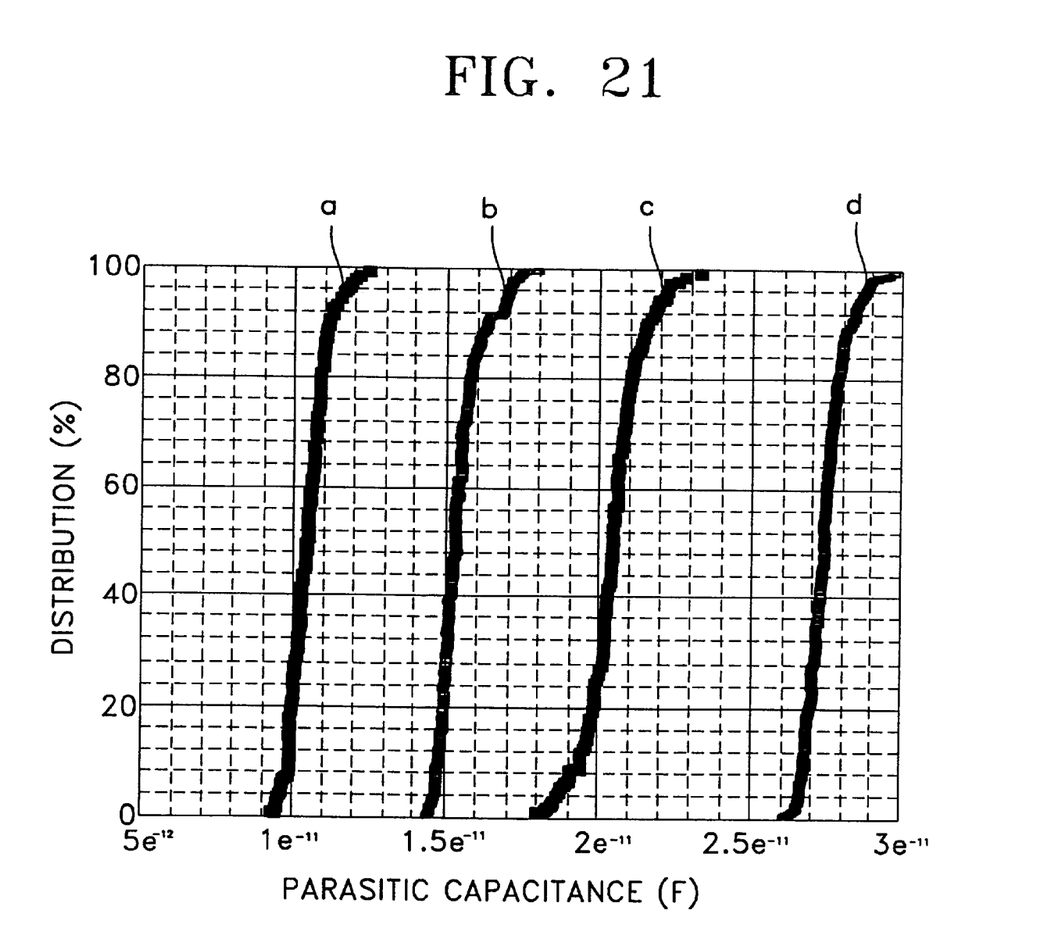
FIG. 21 is a graph showing parasitic capacitance of the semiconductor memory device according to the present invention.

FIG. 21 is a graph showing parasitic capacitance of the semiconductor memory device according to the present invention. In detail, in FIG. 21, "a" and "c" represent parasitic capacitance of the semiconductor memory device shown in FIG. 20. "b" and "d" represent parasitic capacitance of a single bit line spacer formed of silicon nitride in the semiconductor memory device shown in FIG. 20. Also, "a" and "b" represent the parasitic capacitance between the bit line and the storage electrode, and "c" and "d" represent the sum of all types of parasitic capacitances. As shown in FIG. 21, the parasitic capacitance between the bit line and the storage electrode and the sum of all the parasitic capacitances are smaller for the bit line spacers formed of the combination of materials having different dielectric constants than for the bit line spacers formed of the single layer.

As describe above, in the semiconductor memory device of the present invention, the bit line spacers are made of the combination of materials having different dielectric constants, e.g, silicon nitride, silicon oxide, and silicon nitride and can reduce parasitic bit line capacitance more than the single bit line spacer.

As stated above, although the invention has been described with reference to various preferred embodiments, it will be apparent to one of ordinary skill in the art that modification of the described embodiments may be made without departing from the spirit and scope of the invention. Therefore, the scope of the invention, as defined by the following claims, should not be limited to the preferred embodiments described herein.

What is claimed is:

1. A semiconductor memory device comprising:
   a conductive pad formed on a semiconductor substrate;
   a first interlayer insulating layer having a first contact hole formed therein that exposes the conductive pad, the first interlayer insulating layer overlying the conductive pad;
   a bit line stack formed on the first interlayer insulating layer;
   bit line spacers formed on sidewalls of the bit line stack formed from a combination of materials having different dielectric constants;
   a second interlayer insulating layer having a second contact hole formed therein overlying the first contact hole, the second interlayer insulating layer formed on the bit line stack; and
   a conductive plug formed within the first and second contact holes.

2. The semiconductor memory device of claim 1, further comprising a storage electrode of a capacitor coupled to the conductive pad via the conductive plug.

3. The semiconductor memory device of claim 1, wherein the bit line spacers are stack layers including nitride, oxide, and nitride on the sidewalls of the bit line stack.

4. The semiconductor memory device of claim 1, wherein the bit line spacers are stack layers including oxide and nitride on the sidewalls of the bit line stack.

5. The semiconductor memory device of claim 1, wherein the bit line stack is a stack layer including a bit line conductive layer and a bit line capping layer.

6. A semiconductor memory device comprising:
   gate stacks formed over a semiconductor substrate;
   gate spacers formed on sidewalls of the gate stacks;
   a first interlayer insulating layer having a first contact hole that exposes the semiconductor substrate between the gate spacers;
   bit line contact (DC) and storage node contact (BC) pads formed within the first contact hole;
   a second interlayer insulating layer having a DC contact hole that exposes the DC pad;
   a bit line stack that fills the DC contact hole, the bit line stack coupled to the DC pad;
   bit line spacers formed from a combination of materials having different dielectric constants, the bit line spacers formed on sidewalls of the bit line stack;
   a third interlayer insulating layer having a second contact hole that exposes the BC pad, the third interlayer insulating layer being self-aligned with the bit line spacers; and
   a conductive plug formed within the second contact hole.

7. The semiconductor device of claim 5, further comprising a storage electrode connected to the BC pad via the conductive plug.

8. The semiconductor memory device of claim 5, wherein the gate stack is a stack layer including a gate dielectric layer, a gate conductive layer, and a gate capping layer.

9. The semiconductor memory device of claim 5, wherein the bit line stack is a stack layer including a barrier metal layer, a bit line conductive layer, and a bit line capping layer.

10. The semiconductor memory device of claim 5, wherein the bit line spacers are stack layers including nitride, oxide, and nitride on the sidewalls of the bit line stack.

11. The semiconductor memory device of claim 5, wherein the bit line spacers are layers including oxide and nitride on the sidewalls of the bit line stack.

12. A method of fabricating a semiconductor memory device, comprising:
    forming a conductive pad on a semiconductor substrate;
    forming a first interlayer insulating layer overlying the conductive pad;
    forming bit line stacks on the first interlayer insulating layer, a region of the interlayer insulating layer exposed between the bit line stacks;
    forming a combination layer of materials having different dielectric constants on the bit line stacks and on the exposed region of the first interlayer insulating layer;
    etching the combination layer to form bit line spacers on sidewalls of the bit line stack;
    forming a second interlayer insulating layer to fill spaces between the bit line spacers;
    patterning the first and second interlayer insulating layers to form a contact hole to expose the conductive pad, the contact hole self-aligned with the bit line spacers; and
    forming a conductive plug formed within the contact hole.

13. The method of claim 10, further comprising forming a storage electrode of a capacitor on the conductive plug.

14. The method of claim 10, wherein the bit line spacers are stack layers including nitride, oxide, and nitride on both sidewalls of the bit line stack.

15. The method of claim 10, wherein the bit line spacers are stack layers including oxide and nitride on the sidewalls of the bit line stack.

16. The method of claim 12, wherein the nitride on the sidewalls of the bit line stack is formed by a nitrogen treatment after formation of the bit line stack.

17. The method of claim 16, wherein the nitrogen treament is a nitrogen plasma treament.

18. The method of claim 10, wherein the bit line stack is a stack layer including a bit line conductive layer and a bit line capping layer.

19. The method of claim 13, wherein the bit line capping layer is formed of silicon nitride, and the first and second interlayer insulating layers are formed of silicon oxide.

20. A method of fabricating a semiconductor memory device, comprising:

forming gate stacks on a semiconductor substrate;

forming gate spacers on sidewalls of the gate stack;

forming a first interlayer insulating layer having a first contact hole therein, the first hole exposing a region of the semiconductor substrate between the gate spacers;

forming bit line contact (DC) and storage node contact (BC) pads within the first contact hole;

forming a second interlayer insulating layer having a DC contact hole that exposes the DC pad;

forming bit line stacks that fill the DC contact hole to be coupled to the DC pad;

forming bit line spacers from a combination of materials having different dielectric constants on sidewalls of the bit line stacks;

forming a third interlayer insulating layer having a second contact hole, which is self-aligned with the bit line spacers, to expose the BC pad;

forming a conductive plug within the second contact hole; and forming a storage electrode coupled to the BC pad via the conductive plug.

21. The method of claim 15, wherein the gate stack is a stack layer including a gate dielectric layer, a gate conductive layer, and a gate capping layer.

22. The method of claim 15, wherein a conductive layer is formed and planarized on the semiconductor substrate, on which the first contact hole is formed, to form the DC and BC pads.

23. The method of claim 15, wherein the bit line stack is a stack layer including a barrier layer, a bit line conductive layer, and a bit line capping layer.

24. The method of claim 15, wherein the bit line spacers are stack layers including nitride, oxide, and nitride on sidewalls of the bit line stack.

25. The method of claim 14, wherein the bit line spacers are stack layers include oxide and nitride on the sidewalls of the bit line stack.

26. The method of claim 19, wherein the nitride on the sidewalls of the bit line stack is formed by a nitrogen treatment after formation of the bit line stack.

27. The method of claim 19, wherein the nitrogen treatment is a nitrogen plasma treatment.

28. The method of claim 15, wherein a conductive layer is formed and planarized on the semiconductor substrate, on which the second contact hole is formed, to form the conductive plug.

* * * * *